United States Patent
Culpin

(10) Patent No.: US 12,126,165 B2
(45) Date of Patent: Oct. 22, 2024

(54) POWER DISTRIBUTION NETWORK

(71) Applicant: Lilium eAircraft GmbH, Wessling (DE)

(72) Inventor: Ed Culpin, Wessling (DE)

(73) Assignee: Lilium eAircraft GmbH, Wessling (DE)

(*) Notice: Subject to any disclaimer, the term of this patent is extended or adjusted under 35 U.S.C. 154(b) by 0 days.

(21) Appl. No.: 17/651,730

(22) Filed: Feb. 18, 2022

(65) Prior Publication Data

US 2022/0271529 A1 Aug. 25, 2022

(30) Foreign Application Priority Data

Feb. 19, 2021 (EP) ...................................... 21158137

(51) Int. Cl.
*H02H 7/22* (2006.01)
*B64D 41/00* (2006.01)

(52) U.S. Cl.
CPC ............... *H02H 7/22* (2013.01); *B64D 41/00* (2013.01); *B64D 2221/00* (2013.01)

(58) Field of Classification Search
CPC ....... H02H 7/22; B64D 41/00; B64D 2221/00
USPC .......................................................... 307/9.1
See application file for complete search history.

(56) References Cited

U.S. PATENT DOCUMENTS

| | | | | | |
|---|---|---|---|---|---|
| 4,357,545 | A | * | 11/1982 | Le Grand | ................ H04B 3/44 307/64 |
| 2008/0103630 | A1 | * | 5/2008 | Eckroad | .................... H02J 3/02 700/286 |
| 2011/0106325 | A1 | * | 5/2011 | Opina, Jr. | ................. H02J 3/40 700/287 |
| 2012/0007424 | A1 | * | 1/2012 | Maier | .................. H02J 3/0073 307/18 |
| 2013/0215543 | A1 | | 8/2013 | Hoeven | |
| 2013/0253716 | A1 | | 9/2013 | Gross et al. | |
| 2013/0270902 | A1 | | 10/2013 | Andersen et al. | |
| 2016/0023754 | A1 | | 1/2016 | Wiegand | |

(Continued)

FOREIGN PATENT DOCUMENTS

| | | |
|---|---|---|
| CN | 102570502 A | 7/2012 |
| CN | 103155328 A | 6/2013 |

(Continued)

OTHER PUBLICATIONS

Phani Babu, Ring Main Distribution with RMU, 2019, Electrical Engineering Materials (Year: 2019).*

(Continued)

*Primary Examiner* — Rexford N Barnie
*Assistant Examiner* — Swarna N Chowdhuri
(74) *Attorney, Agent, or Firm* — TraskBritt

(57) ABSTRACT

Provided is a power distribution network. The power distribution network comprises a ring-formed power line and a plurality of power nodes connected to the ring-formed power line. In addition, the power distribution network includes a plurality of circuit protection units, wherein each of the circuit protection units is provided between one of the plurality of power nodes and the ring-formed power line or on the ring-formed power line between two adjacent power nodes. The present disclosure is defined by the accompanying claims and is not limited to the particulars of the embodiments of the above detailed description.

6 Claims, 7 Drawing Sheets

(56) References Cited

U.S. PATENT DOCUMENTS

| | | | |
|---|---|---|---|
| 2017/0225802 A1* | 8/2017 | Lussier | E04H 12/18 |
| 2019/0280479 A1 | 9/2019 | Rauwolf et al. | |
| 2020/0010187 A1* | 1/2020 | Bevirt | B64D 27/24 |
| 2021/0126458 A1* | 4/2021 | White | H02J 3/0012 |
| 2021/0300194 A1* | 9/2021 | Thrun | B60L 53/24 |

FOREIGN PATENT DOCUMENTS

| | | | |
|---|---|---|---|
| EP | 2442417 A1 | 4/2012 | |
| FR | 3079210 A1 | 9/2019 | |

OTHER PUBLICATIONS

European Communication pursuant to Article 94(3) EPC for European Application No. 21158137.6, dated Jan. 30, 2023, 5 pages.

International Search Report for International Application No. PCT/EP2022/052657, mailed May 11, 2022, 5 pages.

International Written Opinion for International Application No. PCT/EP2022/052657, mailed May 11, 2022, 5 pages.

Anonymous: "IEEE Guide for Protective Relaying of Utility-Consumer Interconnections", IEEE Power Engineering Society, IEEE Standard C37.95(TM)-2002, (Apr. 17, 2003) 49 pages., Jul. 9, 2021.

European Extended Search Report from European Application No. 21158137.6, dated Jul. 9, 2021, 7 pages., Jul. 9, 2021.

Park et. al., "DC Ring-Bus Microgrid Fault Protection and Identification of Fault Location", IEEE Transactions on Power Delivery, vol. 28, No. 4 (Oct. 2013) pp. 2574-2584., Jul. 9, 2021.

Babu, Phani, Ring main Distributio8n with RMU, Electrical Engineering Materials (Jun. 7, 2019), https://electengmaterials.com/ring-main-distribution-with-rmu/, 7 pages.

European Communication pursuant to Article 94(3) EPC for European Application No. 21158137.6, dated Sep. 28, 2023, 5 pages.

European Communication Pursuant to Article 94(3) EPC dated May 6, 2024, 7 pages.

IEEE Guide for Aircraft Electric Systems, The Institute of Electrical and Electronics Engineers, Inc., (Jan. 1, 1976), 114 pages.

Chinese First Office Action for CN Application No. 202210149579.2, dated May 20, 2024, with english translation, 13 pages.

Chinese Search Report for CN Application No. 202210149579.2, dated May 15, 2024, 2 pages.

* cited by examiner

POWER DISTRIBUTION NETWORK

CROSS-REFERENCE TO RELATED APPLICATION

Pursuant to 35 U.S.C. § 119(a), this application claims the benefit of the filing date of European Patent Application Serial No. EP21158137.6, filed Feb. 19, 2021, for "Power Distribution Network," the disclosure of which is hereby incorporated herein in its entirety by this reference.

TECHNICAL FIELD

The present disclosure relates to a power distribution network, a method for a power distribution network, and an aircraft.

BACKGROUND

In recent years, electricity gained increasing importance as a firm of energy for driving air vehicles. This includes, in particular, electric aircrafts with vertical take-off and landing functionality (eVTOL).

A crucial component for electric (i.e., electrically driven/electrically propelled) aircrafts, including eVTOL, is an appropriate power distribution system distributing power between a plurality of energy storage systems (ESS) and a plurality of loads like propulsion units, in particular, electric propulsion units (EPUs).

An ESS may be realized in form of a battery system of chargeable batteries, which may be structured into a plurality of individual battery cells. A propulsion unit may be an electric propulsion unit like a propeller or a ducted propeller of the aircraft or a plurality of these. A load may comprise a plurality of propulsion units.

Generally speaking, the function of a power distribution network includes distributing power among the loads and power sources during operation of the aircraft, i.e., balancing the plurality of ESSs during operation. Further, a power distribution purpose serves the purpose of charging the plurality of ESSs on the ground, using an external power source, for instance.

As it is generally the case with respect to air traffic, highest safety standards are applicable to the components of aircrafts, including the ESSs, loads (EPUs) and the power distribution system. In order to ensure safe operation during flight and on the ground, for instance, during charging, failures of a power distribution network and, in particular, of ESSs and EPUs, should be detected and dealt with in a manner maximizing safety, wherein the primary function of an aircraft, namely maintaining a safe state during flight, should be maintained as far as possible. Further, in order to increase safety, a failure within an ESS, an EPU or any other component of a power distribution system should be prevented from affecting other components in a harmful manner.

It is thus a crucial task during the design of a power distribution system, in particular, for application within an aircraft, that a failure of any component may be detected and prevented from affecting other components. In this respect, the measures to be taken for preventing a failure to affect other components should limit the function of the other components as little as possible. Preferably, the function of other components is not affected by the measures taken for limiting the influence of a detected failure at all.

BRIEF SUMMARY

The present disclosure aims to provide a power distribution network and to provide a power distribution method for a power distribution network capable of detecting failures and taking appropriate measures so as to maximize safety by limiting the influence of the failure on other components and at the same time, maintaining the function of the power distribution network and, in particular, of its components like power sources and loads not exhibiting a failure condition.

This is achieved by the features of the independent claims. The dependent claims describe advantageous embodiments.

According to an aspect of the present disclosure, a power distribution network is provided. The power distribution network comprises a ring-formed power line and a plurality of power nodes connected to the ring-formed power line. In addition, the power distribution network includes a plurality of circuit protection units, wherein each of the circuit protection units is provided between one of the plurality of power nodes and the ring-formed power line or on the ring-formed power line between two adjacent power nodes.

It is the particular approach of the present disclosure to provide a power distribution network capable of separating a power node from the power distribution network when a failure occurred within the power node. At the same time, the failure is prevented from affecting other parts of the power distribution network, thereby ensuring their respective functions. In other words, the power distribution network may allow for protecting the remaining power nodes from an influence by the failure within one of the power nodes. At the same time, the power distribution network may allow for power balancing during failure free operation for balancing power between the plurality of power nodes. Further, the power distribution network may allow for charging of power nodes.

This is achieved by providing an inner ring-formed power line, to which a plurality of power nodes is connected, together with a plurality of circuit protection units. Each of the circuit protection units is positioned in between the ring-formed power line and a power node, or on the power line in between adjacent power nodes. In other words, the topology of the power distribution network is of a hybrid star- and ring-type. Specifically, the power nodes are connected to an inner ring (i.e., the ring-formed power line) in a star-like manner. Due to the use of the ring-formed power line, power balancing and/or charging may be performed successfully even in a case where a failure occurs on a section of the ring-formed power line. For instance, in a case where a section of the ring-formed power line is interrupted, power balancing and/or charging may still be successfully performed, as the electrical connection between the power nodes is maintained, due to the ring-configuration of the power line.

Further, a power node exhibiting a failure condition may be separated from the power distribution network. This may be achieved, for instance, by an interruption of the electrical connection through certain circuit protection units connecting the power node exhibiting the failure condition with the ring-formed power line. Alternatively, when the circuit protection units are provided on the power line between adjacent power nodes, a power node exhibiting a failure condition may be separated from the power distribution network by interrupting the electrical connection through the circuit protection units on the power line adjacent to the power node exhibiting the failure condition.

Preferably, at least one of the plurality of power nodes includes an energy storage unit and a load. For instance, the energy storage unit is a battery, a battery system, or an energy storage system comprising a battery/battery system and certain controllers and/or sensors configure to monitor the battery state and to control the operation of the battery/ battery system. The load, for instance, may be a propulsion unit like a propeller or a ducted propeller, which is electrically driven. The energy storage unit may be connected to the load and may be configured to serve as a power source for operation of the load. Further, due to the connection of the energy storage unit and the load to the ring-formed power line, energy balancing between energy storage units of other power nodes may be performed efficiently.

In an embodiment, two or more of the plurality of power nodes include an energy storage unit and a load each. For instance, a predetermined number of the plurality of power nodes may each include an energy storage unit and a load. For instance, all of the power nodes include an energy storage unit and a respective node.

In a preferred embodiment, the power distribution network includes a failure detection unit, which is configured to detect a failure of a power node. In addition or alternatively, the failure detection unit detects a failure of a section of the ring-formed power line.

This allows for detection of a failure condition of the power nodes and the sections of the ring-formed power line. The failure detection unit may be formed by a controller, a logic circuit or the like. A section of the ring-formed power line may be a predetermined part of the ring-formed power line. For instance, sections of the ring-formed power line may be the parts of the power line in between connections to the plurality of power nodes.

Preferably, the plurality of circuit protection units is configured to disconnect a power node, for which a failure is detected by the failure detection unit, from the power distribution network.

This allows for separation of a power node exhibiting a failure condition. In consequence, for instance, the failure occurring in the power node may be prevented from affecting the other power nodes and/or their components.

In a preferred embodiment, the circuit protection units are provided on the ring-formed power line between two adjacent nodes. In this preferred embodiment, the plurality of circuit protection units is configured to disconnect a section of the ring-formed power line, for which a failure is detected by the failure detection unit, from the power distribution network.

This allows for separating a section of the power line exhibiting a failure condition from the remaining power distribution network, thereby preventing the failure condition from affecting the remaining power distribution network and/or its components.

In a further preferred embodiment, the power distribution network includes two or more switch units. Each switch unit is provided on the ring-formed power line between two adjacent power nodes.

The switch units provided on the power line allow a separation of the power distribution network into at least two parts, wherein the parts are either connected to each other or separated from each other, depending on the states of the switches.

Preferably, each switch unit is configured to operate in an open state if no failure is detected by the failure detection unit.

This allows for electrical separation during normal operation of the power distribution network. A failure occurring in a first part of the network does not affect the second part. Hence, proper operation of the second part may be ensured, even if a failure occurs in the first part.

Preferably, each switch unit is configured to operate either in an open state or in a closed state according to a failure detected by the failure detection unit.

This allows for dynamic, i.e., during operation, reconfiguration of the power distribution network. In a case where a failure occurs in the power line of a first part of the power distribution network, a switch may be closed. The resulting electrical connection of at least two parts of the power distribution network may allow for operation of a large art of the power distribution network. For instance, as described further above, the part (section of the power line or a power node) may be separated from the remaining network by the circuit protection units and/or the switches, whereas the remaining parts of the power distribution network are electrically connected, thereby ensuring proper operation of the entire remaining part of the power distribution network.

Preferably, each switch unit is configured to operate in a closed state if a failure is detected by the failure detection unit.

This allows for electrically connecting all parts of the power distribution network, thereby allowing for proper operation of a maximum portion of the power distribution network.

In a preferred embodiment, at least one power node comprises a first sensor. The first sensor is configured to detect a physical property of the power node. Further, the failure detection unit is configured to detect a failure of the at least one power node using the detected physical property of the power node.

The sensor may include a temperature sensor configured to detect a temperature of the power node, an energy storage unit and/or a load included in the power node. The sensor may, in addition or alternatively, include a voltage sensor configured to detect an output voltage of an energy storage unit included in the power node. The sensor may, in addition or alternatively, include a current sensor configured to detect an output current of an energy storage unit included in the power node, an input current of a load included in the power node, and/or a current flowing between the power node and the ring-formed power line. This allows for failure detection depending on physical quantities of the power node.

In a further preferred embodiment, the power distribution network comprises a second sensor. The second sensor is configured to detect a physical property of a section of the ring-formed power line. Further, the failure detection unit is configured to detect a failure of the section of the ring-formed power line using the detected physical property of the section of the ring-formed power line.

The sensor may include a temperature sensor configured to detect a temperature of the section of the power line. The sensor may, in addition or alternatively, include a voltage sensor configured to detect a voltage of the section of the power line. The sensor may, in addition or alternatively, include a current sensor configured to detect a current flowing through the section of the power line. This allows for failure detection depending on physical quantities of the power line.

Preferably, each circuit protection device is configured to interrupt its electrical connection if a current through the circuit protection unit is above a current threshold.

This may allow for overcurrent protection of a power node and/or a section of the ring-formed power line. Further, the circuit protection units may serve for separating faulty power node and/or section of the ring-formed power line from the remaining part of the power distribution network.

According to a further aspect of the present disclosure, an aircraft is provided. The aircraft comprises a power distribution network according to the above described aspect of the present disclosure or any one of its embodiments.

Preferably, the aircraft is an electric vertical take-off and landing aircraft, eVTOL.

According to an aspect of the present disclosure, a power distribution method for a power distribution network is provided. The power distribution network may be the power distribution network according to the above aspect of the present disclosure or any embodiment thereof. The method comprises detecting a failure of a power node and/or a failure of a section of the ring-formed power line. Further, the method comprises disconnecting a power node, for which a failure is detected, or disconnecting a section of the ring-formed power line from the power distribution network.

In a preferred embodiment, wherein the power distribution network comprises at least two switch units provided on the ring-formed power line between two adjacent power nodes, the method further comprises operating the switch units in an open state if no failure is detected, and operating each of the switch units either in the open state or in a closed state according to a detected failure.

BRIEF DESCRIPTION OF THE DRAWINGS

Additional features and advantages of the present disclosure will become apparent in the following and more particular description as illustrated in the accompanying drawings, wherein.

DETAILED DESCRIPTION

Figure 1:
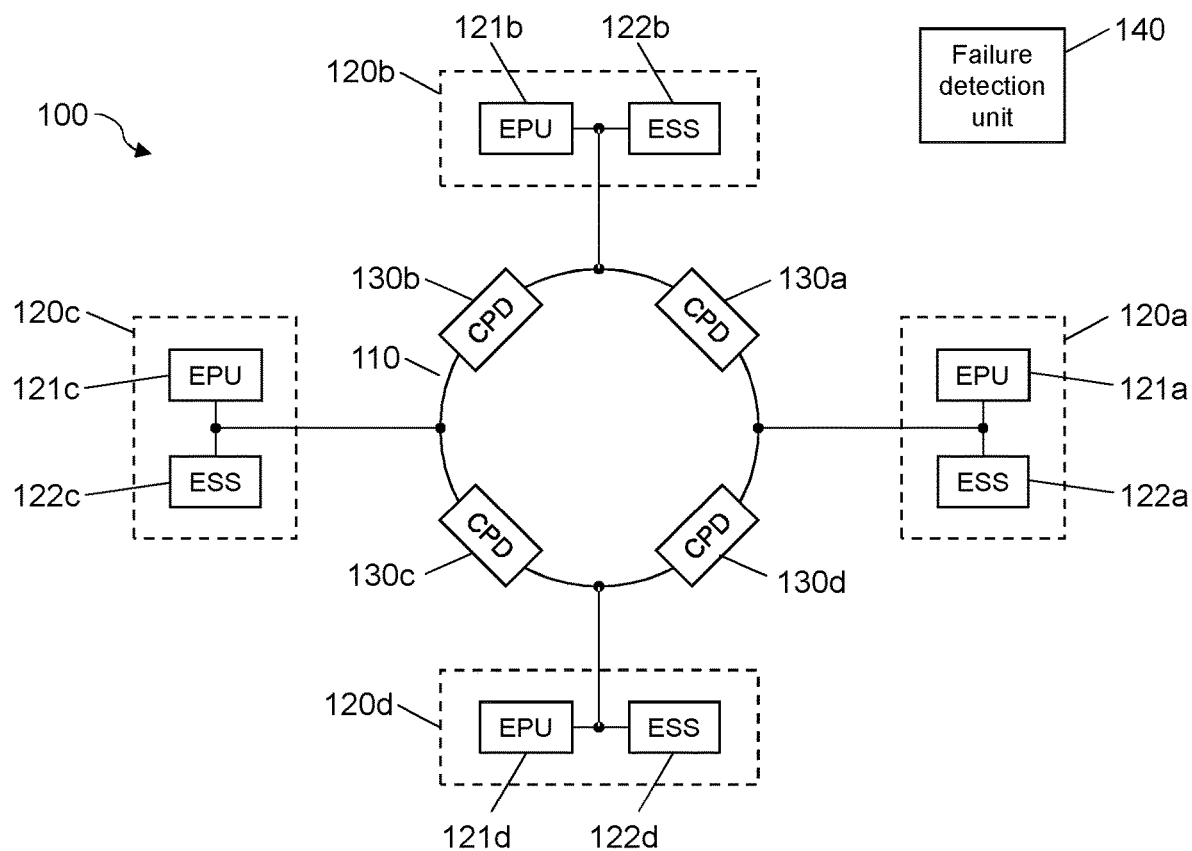
FIG. 1 is a schematic illustration of a power distribution network according to a first embodiment.

The present disclosure relates to a power distribution system for electrically driven aircrafts, for example. The power distribution network may allow for dynamic reconfiguration of the network's setup, thereby ensuring regular operation of a maximum number of power nodes, even if a failure occurs in one of the power nodes or any section of the power distribution network.

For this purpose, an innovative network topology is utilized, wherein a plurality of power nodes is connected to a ring-formed power line. In other words, the power distribution network includes an inner power line configured in a ring-formed manner, i.e., forming a loop. Each power node is connected to the power line in a star-like configuration.

Further, the power distribution network comprises a plurality of circuit protection units. Each of the circuit protection units is either located on the power line in between two adjacent power nodes or between a power node and the power line. In other words, a circuit protection unit may be located on the power line between junctures connecting adjacent power nodes to the ring-formed power line. On the other hand, a circuit protection unit may be located in between a power node and a juncture connecting the power node to the power line.

In embodiments, an energy storage unit and a load are paired so as to form a power node, which is connected to the ring-formed power line. Further in embodiments, the power distribution network comprises a unit (failure detection unit) configured to detect a failure of a power node and/or a failure of a section of the ring-formed network and, based on the detected failure, the circuit protection units may disconnect the faulty power node and/or power line section from the power distribution network.

With this approach, it may be ensured that a failure detected within a component (a power node, a section of the ring-formed power line and/or a part thereof) does not affect the other components or parts of the power distribution network.

In embodiments, the ring-formed power line comprises two or more switches, which are operated in an open state during regular operation of the power distribution network. In other words, in a case where no failure has occurred in one of the components of the power distribution network, the ring-formed power line is formed by at least two parts, which are electrically decoupled from each other. With this approach, a failure occurring within one of the parts of the power distribution network is prevented from affecting the other part(s) of the power distribution network. Further, by closing at least one of the switches, the previously electrically separated parts of the ring-formed power line may be connected to each other, thereby allowing for power balancing between energy storage units of the previously separated parts. At the same time, faulty components may be disconnected by the circuit protection devices.

In general, the power distribution network may serve for a plurality of purposes, including power balancing and/or charging.

The principle outlined above is illustrated in the following detailed description of specific embodiments.

First Embodiment

FIG. 1 is a schematic illustration of a power distribution network according to a first embodiment. The power distribution network 100 comprises a ring-formed power line 110, a plurality of power nodes 120 (120a-120d), a plurality of circuit protection devices 130 (130a-130d) ad a failure detection unit 140.

The ring-formed power line 110 forms an inner electrical connection between junctures connecting the power nodes 120 to the power line 110. The term "ring-formed" relates to the topological characteristic of the power line rather than a concrete physical shape like a circle or the like. In other words, the ring-formed power line is formed by an electrically conducting loop.

The power nodes 120 each include an energy storage system 122 (122a-122d) and a load 121 (121a-121d). Each power node 120 is connected to the ring-formed power line 110 so as to form a star-network configuration. In other words, the power nodes 120 are connected to the power line 110 in parallel to each other.

Although four power nodes 120a-120d are illustrated in FIG. 1, the present disclosure is not limited thereto, and the number of power nodes 120 connected to the power line 110 may be less than four or larger than four. For instance, the number of power nodes may be any number equal to or larger than two.

Further, although every power node is illustrated as including an energy storage system 122 and a load 121, the present disclosure is not limited thereto, and a power node may include a load 121 only, an energy storage unit only, more than one energy storage system 122 and/or more than one load 121. This is illustrated further below.

An energy storage system 122, which is also referred to as an energy storage system (ESS) 122 may be a battery or a battery system, which may be rechargeable. An ESS 122 may include a battery and further components, like a battery controller configured to control operation of the battery, sensors configured to detect certain properties (temperature, output voltage, output current, etc.) of the ESS 122, and the like. For instance, an ESS is a lithium-ion battery.

A load 121 may be any electrically driven load, including, but not limited to, a propulsion device and, specifically, an electric propulsion unit (EPU). In the embodiment illustrated in FIG. 1, each load 121 is an EPU 121. An electrical propulsion unit may be a propeller or, more specifically, an electric propeller. For instance, an EPU may be an electrical ducted propeller or a ducted fan.

In the first embodiment, the power distribution network 100 comprises four circuit protection devices 130, which are located on the ring-formed power line 110 in between connection junctures connecting the power nodes 120 to the ring-formed power line 110. A circuit protection unit may be referred to as a circuit protection device (CPD) 130.

Although four CPDs 130a-130d are illustrated in FIG. 1, the present disclosure is not limited thereto, and the number of CPDs 130 on the power line 110 may be less than four or larger than four. For instance, the number of CPDs 130 may be any number equal to or larger than two. In particular, the number of CPDs 130 may be equal to the number of power nodes 120. However, the number of CPDs 130 may be different from the number of power nodes 120.

The CPDs 130 may be any device capable of switching from a connecting state to an interrupting state. In the connecting state, an electrical connection through the CPD 130 is established, whereas in the interrupting state, there is no electrical connection through the CPD 130 (an electrical breakover notwithstanding). A CPD 130 may be a fuse, a circuit breaker, a controllable switch, an electronically triggered pyro fuse, a transistor like a metal-oxide-semiconductor field-effect transistor (MOSFET) or a power MOSFET.

The power distribution network 100 may include one or more sensors (not illustrated) configured to detect physical properties of the power distribution network 100 or any of its components, like a power node 120, an EPU 121, an ESS 122, a CPD 130 and/or a section of the ring-formed power line 110.

For instance, the ring-formed network may include one or more temperature sensors configured to detect a temperature of a power node 120 or a section of the power line 110. For instance, a temperature sensor may detect a temperature of an ESS 122 and/or a temperature of an EPU 121. In addition or alternatively, for instance, the power distribution network may include one or more voltage sensors configured to detect a voltage. For instance, a voltage sensor may detect an output voltage of an ESS 122 of a power node 120, an input voltage of an EPU 121 of the power node 120, a voltage measured between the power node 120 and the ring-formed power line 110, and/or a voltage at a section of the ring-formed power line 110. In addition or alternatively, the ring-formed power line may include one or more current sensors configured to detect a current. For instance, a current sensor may detect an output current of an ESS 122, an input current of an EPU 121, a current flowing between a power node 120 and the ring-formed power line 110, and/or a voltage flowing through a section of the power line 110.

The failure detection unit 140 is configured to detect a failure occurring in one of the power nodes 120 and/or a section of the ring-formed power line 110. For instance, the failure detection unit may be connected to one or more of above-described sensors and receive a sensor signal indicating a reading a sensor detecting a physical quantity. For instance, the signal may indicate a temperature, a voltage or a current detected as described above. Further, the failure detection unit 140 may determine the occurrence of a failure within a power node 120 by comparing the indicated physical quantity with a respective threshold or normal range. If the indicated physical quantity lies above/below the threshold or outside the normal range, the failure detection unit may determine that a failure within respective component has occurred. For instance, if the detected physical quantity is a temperature of an ESS 122 above a threshold temperature, a failure may be determined to have occurred in the ESS 122. Further, for example, if the detected physical quantity is a current flowing through a CPD 130 above a threshold current, a failure may be determined to have occurred within the section of the ring-formed power line the CPD 130 is located on. Further, for example, if the detected physical quantity is a voltage of an ESS 122 (an output voltage, for instance), a failure may be determined to have occurred in the ESS 122.

The failure detection unit 140 may be connected to the CPDs 130 and trigger the CPDs 130 to transition from a connecting state to an interrupting state, depending on a failure detected within a power node 120, a load 121, an ESS 122 or a section of the ring-formed power line 110. If a failure is detected by the failure detection unit 140, the failure detection unit 140 triggers one or more CPDs 130 to transition from the connecting state to the interrupting state.

Specifically, one or more of the CPDs 130 may be triggered to enter the interrupting state so as to disconnect a power node 120 for which a failure has been detected from the power distribution network. For example, if a failure is detected within power node 120b in FIG. 1, CPDs 130b and 130a are triggered to interrupt their electrical connection such that power node 120b is electrically disconnected from the power distribution network 100.

Further, specifically, one or more of the CPDs 130 may be triggered to enter the interrupting state so as to disconnect or interrupt a section of the ring-formed power line from the power distribution network. For instance, in a case where a failure like an overcurrent flowing through CPD 130a in FIG. 1 is detected, CPD 130a may be triggered to interrupt its electrical connection. In this respect, the CPDs 130 may not be externally triggered to enter the interrupting state in a case of a failure, but may be configured to enter the interrupting state without an external trigger. For instance, the CPDs may be configured to enter the interrupting state in a case where a current flowing through the CPD is above a certain threshold, as it is performed in a fuse.

Due to the ring configuration of the power line 110, the electrical connection between the power nodes 120 is maintained in a case where a specific power node 120 is disconnected from the power distribution network 100 due to a failure occurring therein. Thus, the remaining power nodes 120 may be operated normally in a case of a failure occurring in another power node 120. Further, a failure may be prevented from affecting the remaining power distribution network 100, as the faulty component may be disconnected from the power distribution network.

This approach may allow for maintaining the function of the power distribution network 100 as far as possible and, in consequence, allow for maintaining normal operation of the components not exhibiting a failure condition. Hence, the safety of the power distribution network is being increased, which is of particular importance in a case where the power distribution network 100 is installed in an aircraft, where a minimum amount of propulsion is required to prevent an accident.

Second Embodiment

Figure 2:
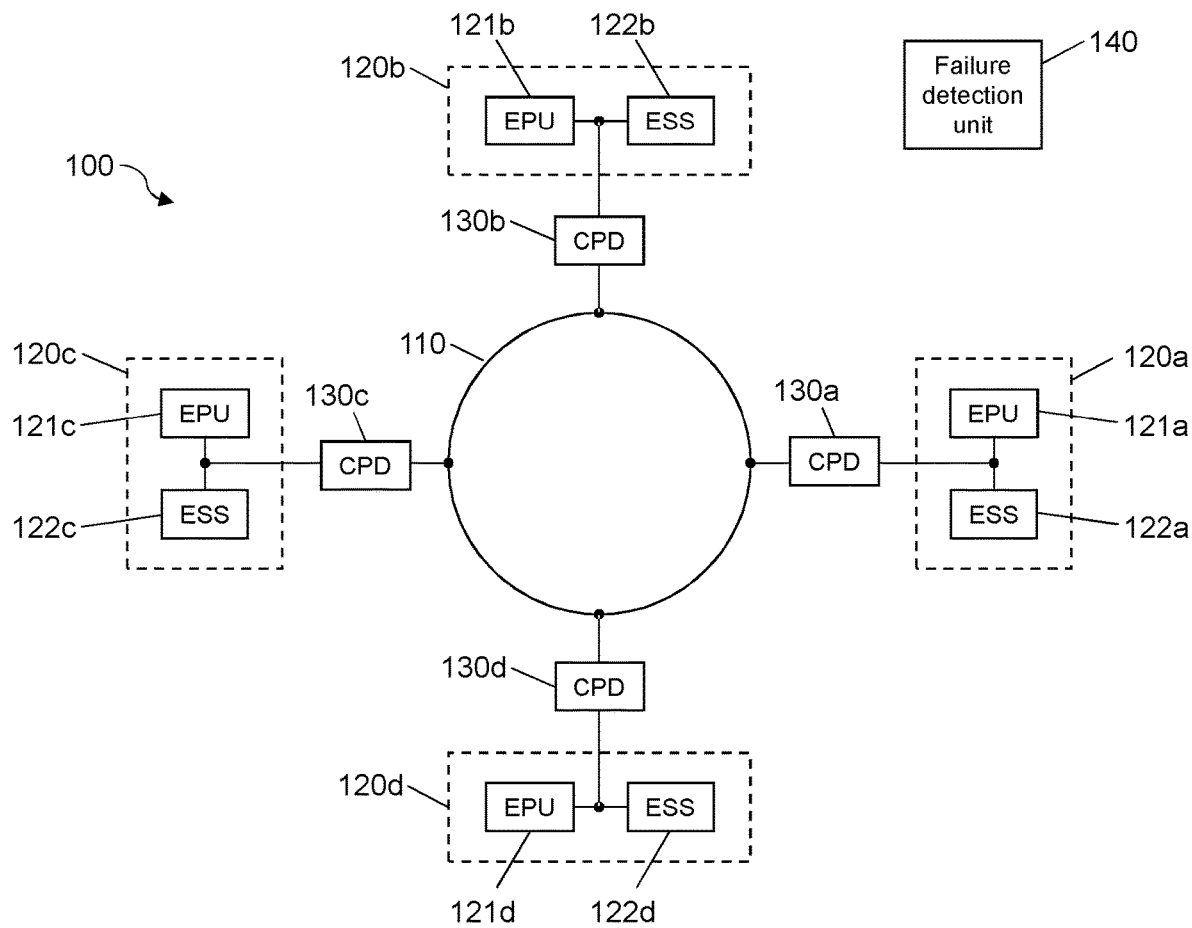
FIG. 2 is a schematic illustration of a power distribution network according to a second embodiment.

FIG. 2 is a schematic illustration of a power distribution network according to a second embodiment. The power distribution network 100 is particularly similar to the power distribution network 100 of the first embodiment. Components of the power distribution network 100 of the second embodiment corresponding to components of the power distribution network 100 of the first embodiment are indicated with the same reference numerals. The configurations of the components of the second embodiment correspond to the configurations of respective components of the first embodiment and above descriptions may equally apply.

The power distribution network 100 of the second embodiment differs from the power distribution network 100 of the first embodiment in that the CPDs 130 are not located on the ring-formed power line 110, but rather in between the power nodes 120 and the power line 110. Specifically, the CPDs are located in between the power nodes and the junctures connecting the power nodes 120 with the ring-formed power line.

The components of the power distribution network 100 may be operated in a similar manner as in the first embodiment. However, as the CPDs 130 are located on the connection between the power nodes 120 and the power line 110, a power node 120 for which a failure state is detected may be disconnected from the remaining power distribution network 100 by interrupting an electrical connection through a CPD 130 in between the faulty power node 120 and the ring-formed power line 110.

For instance, in a case where a failure within the power node 120b in FIG. 2 is detected, the power node 120b may be disconnected from the power distribution network by the CPD 130b entering the interrupting state.

Third Embodiment

Figure 3:
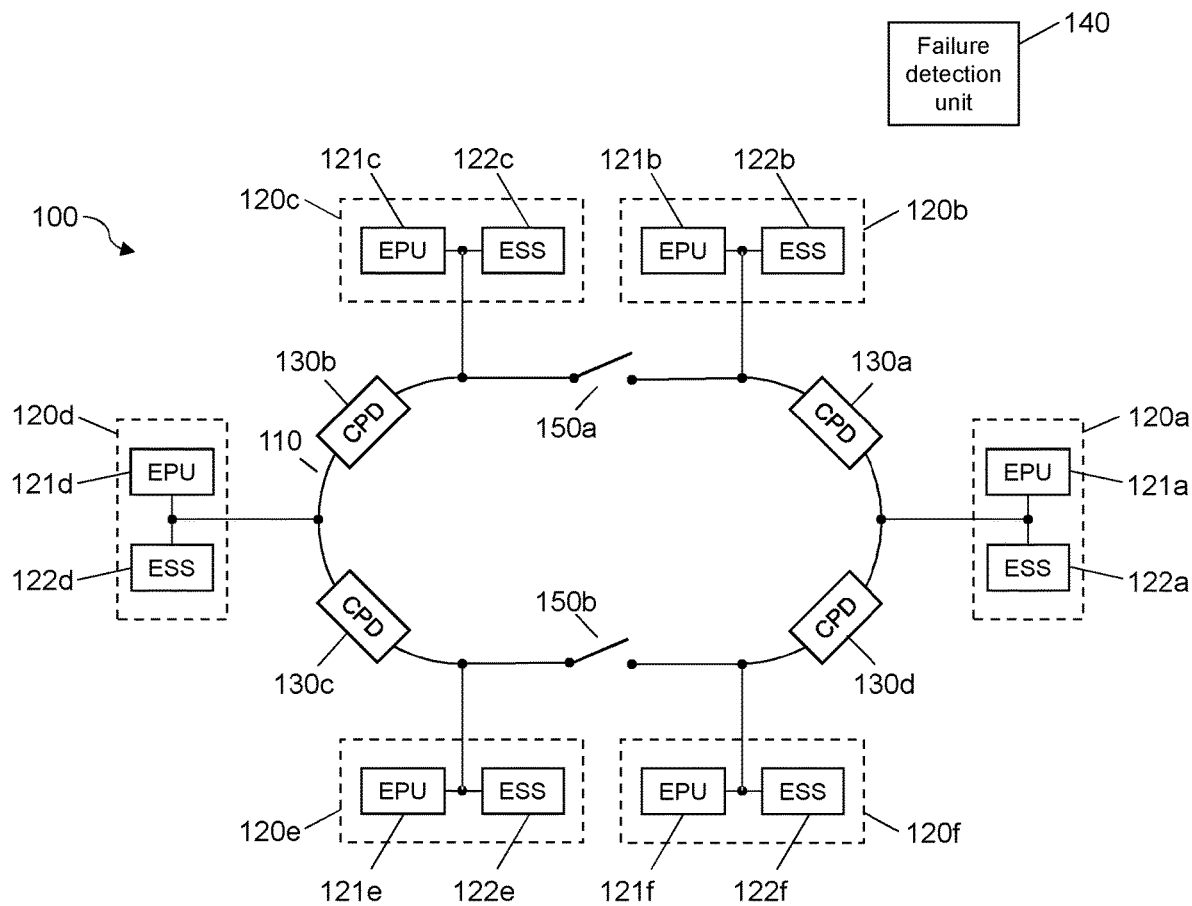
FIG. 3 is a schematic illustration of a power distribution network according to a third embodiment.

FIG. 3 is a schematic illustration of a power distribution network according to a third embodiment. The power distribution network 100 is particularly similar to the power distribution network 100 of the first embodiment. Components of the power distribution network 100 of the third embodiment corresponding to components of the power distribution network 100 of the first or second embodiment are indicated with the same reference numerals. The configurations of the components of the third embodiment correspond to the configurations of respective components of the first or second embodiment and above descriptions may equally apply.

The power distribution network 100 of the third embodiment differs from the power distribution network 100 of the first and second embodiments in that it comprises two switch units 150 (150a and 150b). The switch units are provided on the ring-formed power line 110 and separate the power distribution network 100 into two parts. Each of the parts includes a portion of the power supply line 110, one or more CPDs 130 and one or more power nodes 120.

Each power node 120 comprises an EPU 121 and an ESS 122, paired so as to form the respective power node 120. Each power node 120 is connected to the ring-formed power supply line 110, wherein CPDs 130 are provided on the power supply line 110 in between the power nodes 120. The function of the power nodes 120, the EPUs 121 and the ESSs 122 correspond to the functions of respective elements as described in the first and second embodiments.

The switch units 150 may be controlled so as to be in the open state when no failure has occurred in the power nodes 120 or sections of the power supply line 110. However, the switch units 150 may be controlled by a higher-level control device (not illustrated) and may be open or closed according to control commands to the higher level control device. For instance, during charging on the ground and/or for the purpose of power balancing, the switch units 150 may be controlled to be in the open or the closed state according to the control by the higher-level control device, even if no failure has occurred.

In a case of a failure within a power node 120 or a section of the power supply line 110, the respective power node 120/section of the power supply line 110 may be separated from the power distribution network 100 by the CPDs. Further, the switch unit 150 is configured so as to enter the closed state in a case where a failure has occurred and according to the failure. Thereby, the portions of the power distribution network 100 are connected with each other.

For instance, in a case where a failure occurred in power node 120d, CPDs 130b and 130c may separate power node 120d from the power distribution network 100. Further, the switch units 150a, 150b are configured to enter the closed state, thereby connecting the power nodes 120c and 120e with the portion of the power distribution network 100 including the power nodes 120a, 120b and 120f and CPDs 130a and 130d. Hence, even in a case where a failure has occurred in power node 120d, power balancing may be performed among power nodes 120a-120c, 120e and 120f.

In another example, in a case where a failure occurs in power node 120c, CPD 130b may be controlled to separate power node 120c from the power distribution network 100. Further, switch unit 150b may be controlled to enter the closed state, thereby connecting the two remaining portions of the power distribution network 100. Switch unit 150a may also be controlled to maintain the open state, keeping the failed node 120c isolated from the system.

In other words, the switch units 150 may be controlled, for instance, by the failure detection unit 140, to be either in the open state or the closed state according to a detected failure. For this purpose, the failure detection unit 140 may be configured to control the switch unit 150 according to detected failures. For instance, each failure condition (including, for instance, the type of failure (overcurrent, overtemperature, . . . ), the power node/section of the power supply line 110 within which the failure has occurred) may be associated with a corresponding control of the switch units 150.

Although in the embodiment there is no CPD in between power nodes 120 at a location where a switch unit is provided, the present disclosure is not limited thereto. A CPD may be provided in between adjacent power nodes in addition to the switch unit.

Alternatively, a CPD may provide the functionality of a switch unit, for instance, in a case where a CPD is realized as a controllable switch like a MOSFET.

Fourth Embodiment

Figure 4:
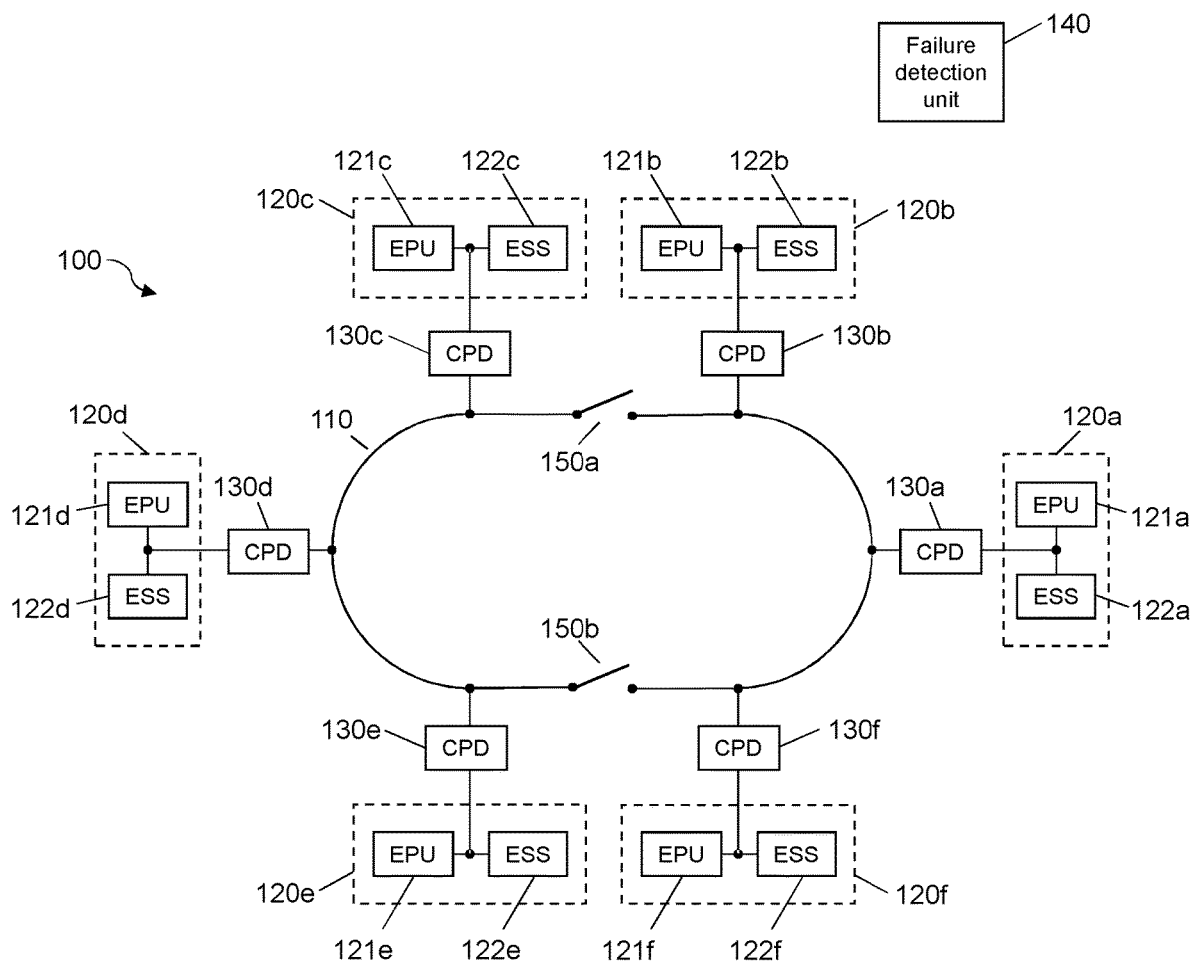
FIG. 4 is a schematic illustration of a power distribution network according to a fourth embodiment.

FIG. 4 is a schematic illustration of a power distribution network according to a fourth embodiment. The power distribution network 100 is particularly similar to the power distribution network 100 of the third embodiment. Components of the power distribution network 100 of the fourth embodiment corresponding to components of the power distribution network 100 of the third embodiment are indicated with the same reference numerals. The configurations of the components of the fourth embodiment correspond to the configurations of respective components of the third embodiment and above descriptions may equally apply.

The power distribution network 100 of the fourth embodiment differs from the power distribution network 100 of the third embodiment in that the CPDs 130 are not located on the ring-formed power line 110, but rather in between the power nodes 120 and the power line 110. Specifically, the CPDs are located in between the power nodes and the junctures connecting the power nodes 120 with the ring-formed power line.

The components of the power distribution network 100 may be operated in a similar manner as in the third embodiment. However, as the CPDs 130 are located on the connection between the power nodes 120 and the power line 110, a power node 120 for which a failure state is detected may be disconnected from the remaining power distribution network 100 by interrupting an electrical connection through a CPD 130 in between the faulty power node 120 and the ring-formed power line 110.

For instance, in a case where a failure within the power node 120b in FIG. 4 is detected, the power node 120b may be disconnected from the power distribution network by the CPD 130b entering the interrupting state.

Variations

In the first to fourth embodiments, the CPDs 130 are either provided on the power supply line 110 between adjacent power nodes 120 or between the power supply line 110 and the respective power node 120. However, the present disclosure is not limited thereto, and a first subset of CPDs may be provided on the power line and a second subset of CPDs may be provided between the power line 110 and the respective power nodes 120.

Figure 5:
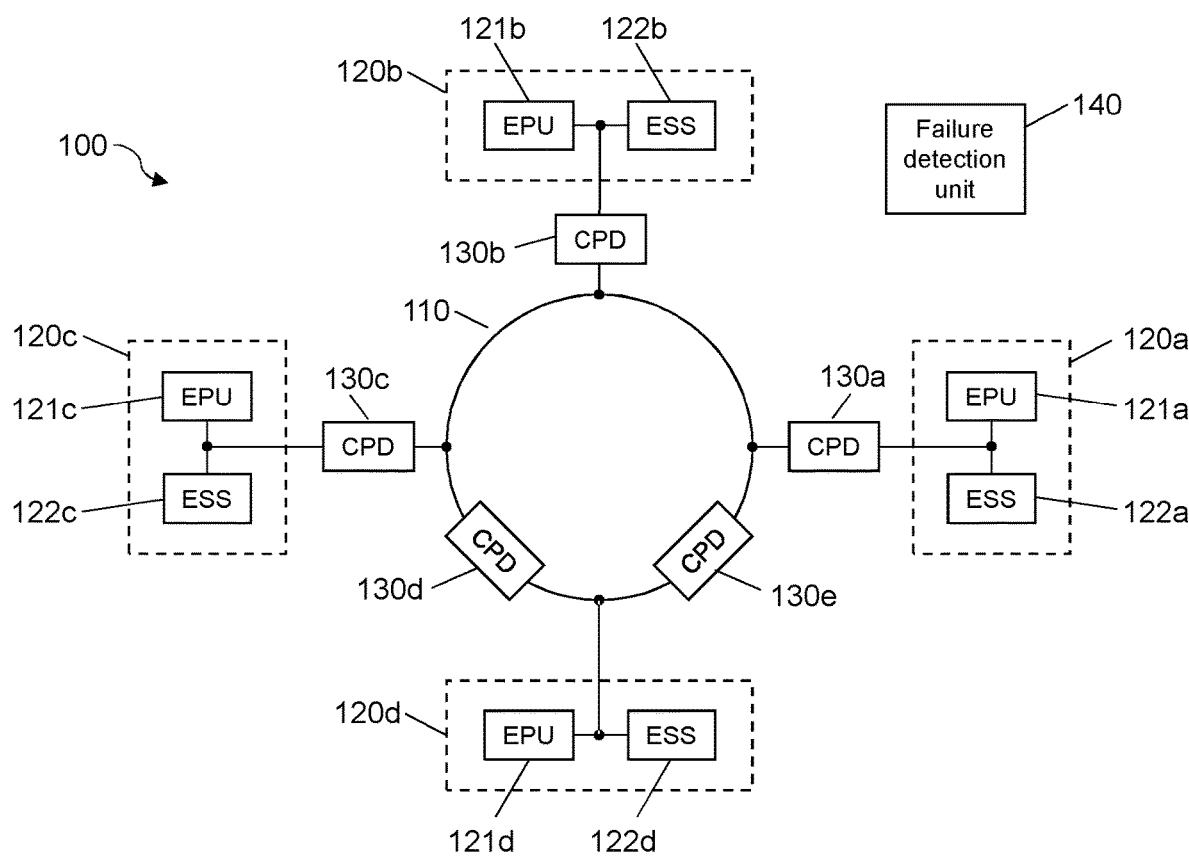
FIG. 5 illustrates further modifications applicable to any of the described embodiments.

FIG. 5 illustrates an example of such a configuration. In the illustrated example, CPDs 130a-130c are provided in between the power nodes 120a-120c and the power supply line 110. CPDs 130d and 130e are provided between the adjacent power nodes 120c/120d and 120e/120a, respectively. A power distribution network according to this configuration may exhibit a higher operation flexibility. It goes without saying that switch unit may be provided in a power distribution network as illustrated in FIG. 5.

In the embodiments described above, a load (an EPU, for example) and an energy storage unit (an ESS, for example) are paired to form a power node. However, a power node may comprise a plurality of loads and/or a plurality of power storage units. Alternatively, a power node may comprise no load or no power storage unit. That is, a power node may comprise one or more loads and/or one or more power storage units.

Method

Figure 6:
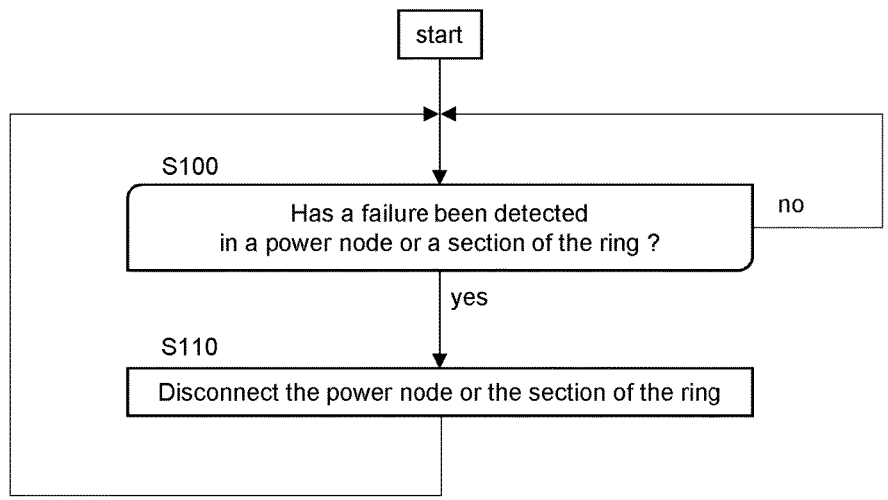
FIG. 6 illustrates the steps of a method according to an embodiment.

FIG. 6 illustrates the steps of a method according to an embodiment. After the method is started, it is determined in step S100 if a failure has occurred in the power distribution network. Specifically, it is determined whether the failure has occurred in a power node and/or a section of the ring-formed power line 110. For instance, it may be determined that a failure has occurred by a failure detection unit using reading of respective sensors, as described above.

In a case where a failure has occurred (yes in step S110), the power node or the section of the ring-formed power line, within which the failure has occurred is disconnected from the power distribution network. This may be performed, for instance, as described in the embodiments above.

Figure 7:
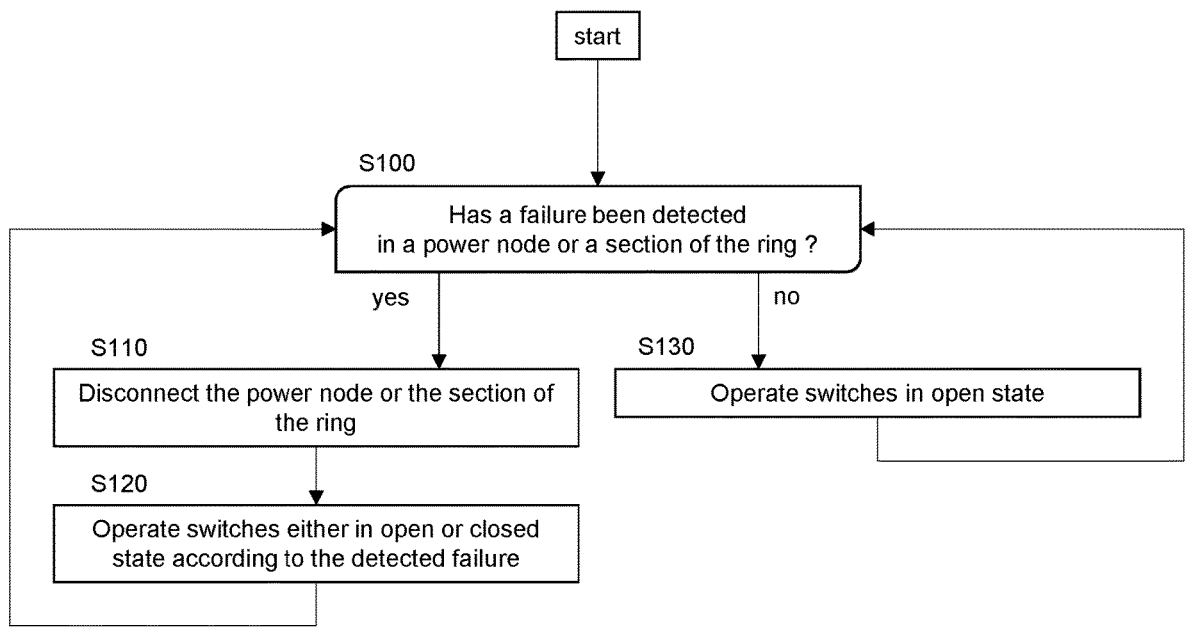
FIG. 7 illustrates the steps of a method according to a modification of the embodiment.

In a variation illustrated in FIG. 7, when the power distribution network includes switch units provided on the power supply line and a failure is detected in step S100 (yes in step S100), the power node/section of the power supply line within which the failure has occurred is disconnected from the power distribution network in step S110 and the switches are operated either in the open or the closed state according to the detected failure in step S120. In a case where no failure has been detected (no in step S100), the switch units may be operated in the open state in step S130, wherein the power distribution network is separated into at least two parts.

However, in step S130, the switch units may be operated according to control performed by a higher-level control device, as described in the embodiments above.

Aircraft

Figure 8:
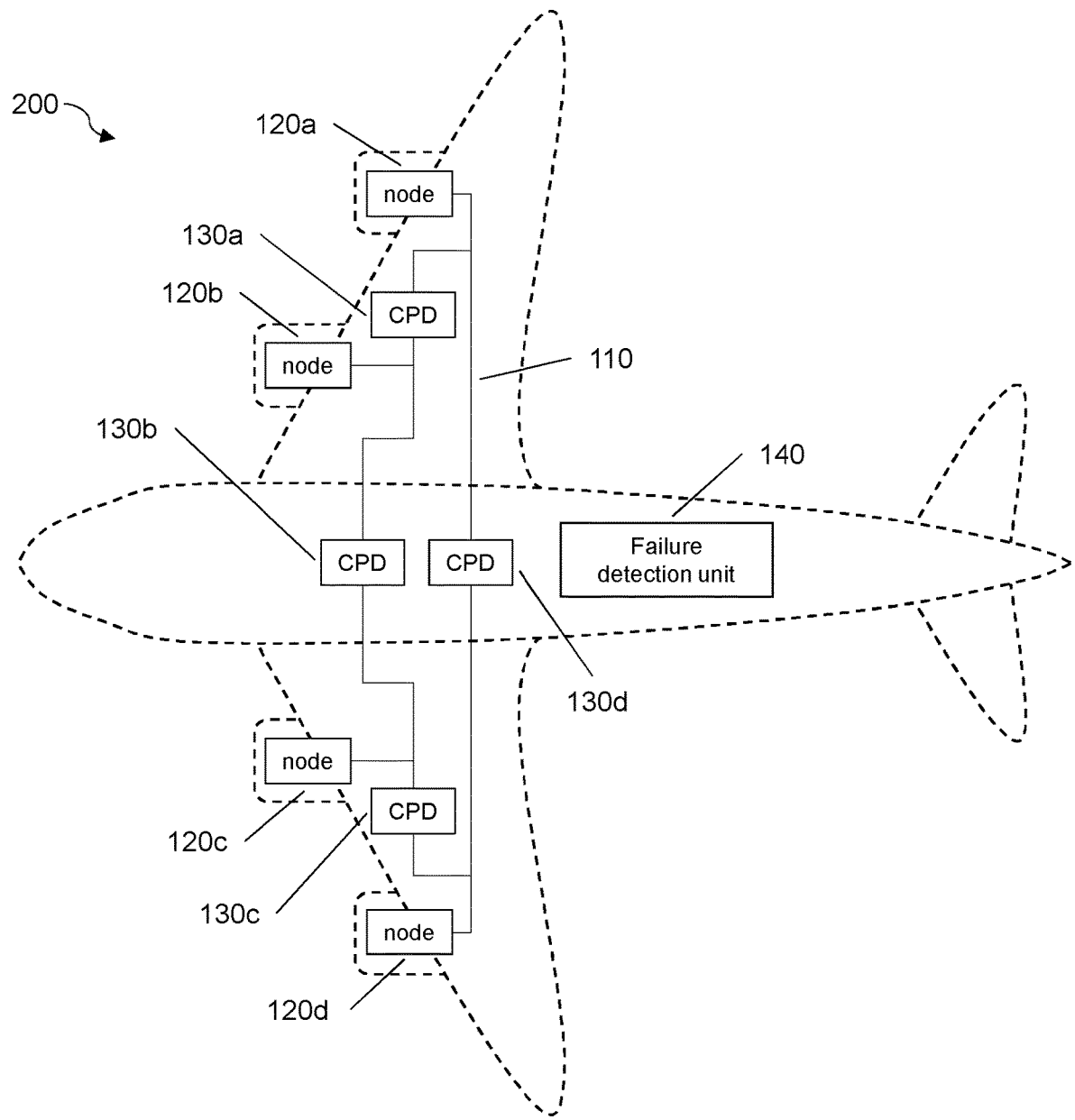
FIG. 8 is a schematic illustration of an aircraft according to an embodiment.

FIG. 8 is a schematic illustration of an aircraft 200 according to an embodiment. The aircraft 200 may be an aircraft having a general configuration as described in US 2016/0023754 A1, for instance. However, the present disclosure is not limited thereto, and the aircraft 200 may be an aircraft having a general configuration of any other conventional aircraft.

As illustrated in FIG. 8, the aircraft 200 comprises a power distribution network in a configuration as illustrated in FIG. 1 (first embodiment). However, the aircraft 200 may comprise a power distribution network according to any embodiment or variation. In the illustrated embodiment, the power nodes 120a-120d are located in a propulsion section of the aircraft and may include an EPU and an ESS. The power nodes 120 are connected to the ring-formed power supply line 110, on which the CPDs 130a-130d are provided.

The present disclosure is defined by the accompanying claims and is not limited to the particulars of the embodiments of the above detailed description.

In summary, the present disclosure relates to a power distribution network. The power distribution network comprises a ring-formed power line and a plurality of power nodes connected to the ring-formed power line. In addition, the power distribution network includes a plurality of circuit protection units, wherein each of the circuit protection units is provided between one of the plurality of power nodes and the ring-formed power line or on the ring-formed power line between two adjacent power nodes. The present disclosure is defined by the accompanying claims and is not limited to the particulars of the embodiments of the above detailed description.

What is claimed is:
1. An aircraft comprising:
 a power distribution network, the power distribution network comprising:
  a ring-formed power line;
  a plurality of power nodes connected to the ring-formed power line, each power node comprising a paired energy storage unit and a load; and
  a plurality of circuit protection units, each circuit protection unit of the plurality of circuit protection units being provided between one of the plurality of power nodes and the ring-formed power line or on the ring-formed power line between two adjacent power nodes;
a failure detection unit configured to detect a failure of a power node and/or a failure of a section of the ring-formed power line, wherein
the plurality of circuit protection units is configured to disconnect a power node, for which a failure is detected by the failure detection unit, from the power distribution network; and
at least two switch units, each switch unit of the at least two switch units being provided on the ring-formed power line between two adjacent power nodes, wherein
each switch unit of the at least two switch units is configured to
operate in an open state if no failure is detected by a failure detection unit, and
operate in a closed state if a failure is detected by a failure detection unit.

2. The aircraft according to claim 1, wherein
each circuit protection unit of the plurality of circuit protection units is provided on the ring-formed power line between two adjacent power nodes, and
the plurality of circuit protection units is configured to disconnect a section of the ring-formed power line, for which a failure is detected by the failure detection unit, from the power distribution network.

3. The aircraft according to claim 1, wherein at least one power node of the plurality of power nodes comprises a first sensor configured to detect a physical property of the power node, and the failure detection unit is configured to detect a failure of the at least one power node using the detected physical property of the power node.

4. The aircraft according to claim 1, further comprising a second sensor configured to detect a physical property of a section of the ring-formed power line, and wherein the failure detection unit is configured to detect a failure of the section of the ring-formed power line using the detected physical property of the section of the ring-formed power line.

5. The aircraft according to claim 1, wherein each circuit protection unit of the plurality of circuit protection units is configured to interrupt its electrical connection if a current through the circuit protection unit is above a current threshold.

6. A power distribution method for an aircraft comprising a power distribution network, the power distribution network comprising a ring-formed power line; a plurality of power nodes connected to the ring-formed power line, and power node comprising a paired energy storage unit and a load; and a plurality of circuit protection units, each circuit protection unit of the plurality of circuit protection units being provided between one of the plurality of power nodes and the ring-formed power line or on the ring-formed power line between two adjacent power nodes; a failure detection unit configured to detect a failure of a power node and/or a failure of a section of the ring-formed power line; at least two switch units, each switch unit of the at least two switch units being provided on the ring-formed power line between two adjacent power nodes, the power distribution method comprising:
detecting a failure of a power node of the plurality of power nodes and/or a failure of a section of the ring-formed power line;
disconnecting a power node of the plurality of power nodes, for which a failure is detected, or a section of the ring-formed power supply line, for which a failure is detected, from the power distribution network;
operating each switch unit in an open state if no failure is detected; and
operating each switch unit in a closed state if a failure is detected.

* * * * *